US009397224B2

(12) United States Patent
Yamazaki

(10) Patent No.: US 9,397,224 B2
(45) Date of Patent: Jul. 19, 2016

(54) SEMICONDUCTOR DEVICE

(71) Applicant: Semiconductor Energy Laboratory Co., Ltd., Atsugi-shi, Kanagawa-ken (JP)

(72) Inventor: Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/451,686

(22) Filed: Aug. 5, 2014

(65) Prior Publication Data
US 2014/0339557 A1 Nov. 20, 2014

Related U.S. Application Data

(62) Division of application No. 13/271,518, filed on Oct. 12, 2011, now Pat. No. 8,803,143.

(30) Foreign Application Priority Data

Oct. 20, 2010 (JP) ................................ 2010-235986

(51) Int. Cl.
*H01L 29/786* (2006.01)
*H01L 29/08* (2006.01)
(52) U.S. Cl.
CPC ........ *H01L 29/7869* (2013.01); *H01L 29/0847* (2013.01); *H01L 29/78621* (2013.01)
(58) Field of Classification Search
None
See application file for complete search history.

(56) References Cited

U.S. PATENT DOCUMENTS

| 5,009,766 | A | 4/1991 | Lauks |
| 5,731,856 | A | 3/1998 | Kim et al. |
| 5,744,864 | A | 4/1998 | Cillessen et al. |
| 6,294,274 | B1 | 9/2001 | Kawazoe et al. |
| 6,563,174 | B2 | 5/2003 | Kawasaki et al. |
| 6,624,864 | B1 | 9/2003 | Kubo et al. |
| 6,727,522 | B1 | 4/2004 | Kawasaki et al. |
| 7,049,190 | B2 | 5/2006 | Takeda et al. |

(Continued)

FOREIGN PATENT DOCUMENTS

| EP | 1737044 A | 12/2006 |
| EP | 1770788 A | 4/2007 |

(Continued)

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

(Continued)

*Primary Examiner* — Robert Bachner
*Assistant Examiner* — Molly Reida
(74) *Attorney, Agent, or Firm* — Robinson Intellectual Property Law Office; Eric J. Robinson

(57) ABSTRACT

A transistor in a display device is expected to have higher withstand voltage, and it is an object to improve the reliability of a transistor which is driven by high voltage or large current. A semiconductor device includes a transistor in which buffer layers are provided between a semiconductor layer forming a channel formation region and source and drain electrode layers. The buffer layers are provided between the semiconductor layer forming a channel formation region and the source and drain electrode layers in order to particularly relieve an electric field in the vicinity of a drain edge and improve the withstand voltage of the transistor.

10 Claims, 5 Drawing Sheets

(56) References Cited

U.S. PATENT DOCUMENTS

| | | |
|---|---|---|
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,910,490 B2 | 3/2011 | Akimoto et al. |
| 7,932,521 B2 | 4/2011 | Akimoto et al. |
| 8,274,077 B2 | 9/2012 | Akimoto et al. |
| 8,466,463 B2 | 6/2013 | Akimoto et al. |
| 8,624,237 B2 | 1/2014 | Yamazaki et al. |
| 8,629,069 B2 | 1/2014 | Akimoto et al. |
| 8,629,432 B2 | 1/2014 | Sakata et al. |
| 8,669,550 B2 | 3/2014 | Akimoto et al. |
| 8,704,216 B2 | 4/2014 | Godo et al. |
| 8,766,252 B2 | 7/2014 | Yamazaki |
| 8,790,959 B2 | 7/2014 | Akimoto et al. |
| 8,796,069 B2 | 8/2014 | Akimoto et al. |
| 8,884,287 B2 | 11/2014 | Sakata et al. |
| 9,064,899 B2 | 6/2015 | Godo et al. |
| 9,099,562 B2 | 8/2015 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1* | 3/2007 | Akimoto et al. .............. 438/795 |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287221 A1* | 12/2007 | Ong ................. H01L 21/02554 438/104 |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308805 A1 | 12/2008 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0025678 A1 | 2/2010 | Yamazaki et al. |
| 2010/0025679 A1* | 2/2010 | Yamazaki et al. ............... 257/43 |
| 2010/0065844 A1 | 3/2010 | Tokunaga |
| 2010/0084654 A1* | 4/2010 | Yamazaki et al. ............... 257/43 |
| 2010/0092800 A1 | 4/2010 | Itagaki et al. |
| 2010/0109002 A1 | 5/2010 | Itagaki et al. |
| 2010/0117077 A1 | 5/2010 | Yamazaki et al. |
| 2010/0194719 A1* | 8/2010 | Saitoh et al. .................. 345/204 |
| 2010/0216285 A1 | 8/2010 | Yokoi et al. |
| 2010/0301329 A1 | 12/2010 | Asano et al. |
| 2011/0012112 A1 | 1/2011 | Yamazaki et al. |
| 2011/0031497 A1 | 2/2011 | Yamazaki et al. |
| 2011/0084263 A1* | 4/2011 | Yamazaki et al. ............... 257/43 |
| 2011/0104851 A1 | 5/2011 | Akimoto et al. |
| 2011/0121290 A1 | 5/2011 | Akimoto et al. |
| 2012/0097941 A1 | 4/2012 | Yamazaki |
| 2012/0273780 A1 | 11/2012 | Yamazaki et al. |
| 2015/0214383 A1 | 7/2015 | Godo et al. |

FOREIGN PATENT DOCUMENTS

| | | |
|---|---|---|
| EP | 1995787 A | 11/2008 |
| EP | 1998373 A | 12/2008 |
| EP | 1998374 A | 12/2008 |
| EP | 1998375 A | 12/2008 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| JP | 2010-186994 A | 8/2010 |

(56) References Cited

FOREIGN PATENT DOCUMENTS

| JP | 2010-226101 A | 10/2010 |
|---|---|---|
| TW | 201023365 | 6/2010 |
| WO | WO-2004/114391 | 12/2004 |

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N. et al., "Spinel,YbFe2O4, and Yb2Fe3O7 Types of Structures for Compounds in the In2O3 and Sc2O3-A2O3-BO Systems [A; Fe, Ga, or Al; B: Mg, Fe, Ni, Cu,or Zn] at Temperatures Over 1000° C.", Journal of Solid State Chemistry, 1985, vol. 60, pp. 382-384.

Nakamura.M et al., "The phase relations in the In2O3-Ga2ZnO4-ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N. et al., "Syntheses and Single-Crystal Data of Homologous Compounds, In2O3(ZnO)m (m=3, 4, and 5), InGaO2(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transations on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Park.S et al., "Challenge to Future Displays: Transparent AM-OLED Driven by Peald Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "SUFTLA Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits, 2008, vol. 43, No. 1, pp. 292-299.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium—Gallium—Zinc Oxide TFTS and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

(56) References Cited

OTHER PUBLICATIONS

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Park.J et al., "High performance amorphous oxide thin film transistors with self-aligned top-gate structure", IEDM 09: Technical Digest of International Electron Devices Meeting, Dec. 7, 2009, pp. 191-194.
Nakamura.M, "Synthesis of Homologous Compound with New Long-Period Structure", NIRIM Newsletter, Mar. 1, 1995, vol. 150, pp. 1-4.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Orita.M et al., "Amorphous transparent conductive oxide InGaO3(ZnO)m (m<4):a Zn4s conductor", Philosophical Magazine, 2001, vol. 81, No. 5, pp. 501-515.
Janotti.A et al., "Oxygen Vacancies in ZnO", Appl. Phys. Lett. (Applied Physics Letters), 2005, vol. 87, pp. 122102-1-122102-3.
Clark.S et al., "First Principles Methods Using CASTEP", Zeitschrift fur Kristallographie, 2005, vol. 220, pp. 567-570.
Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Oba.F et al., "Defect energetics in ZnO: A hybrid Hartree-Fock density functional study", Phys. Rev. B (Physical Review. B), 2008, vol. 77, pp. 245202-1-245202-6.
Kim.S et al., "High-Performance oxide thin film transistors passivated by various gas plasmas", 214th ECS Meeting, 2008, No. 2317, ECS.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Mo.Y et al., "Amorphous Oxide TFT Backplanes for Large Size AMOLED Displays", IDW '08 : Proceedings of the 6th International Display Workshops, Dec. 3, 2008, pp. 581-584.
Asakuma.N et al., "Crystallization and Reduction of SOL-GEL-Derived Zinc Oxide Films by Irradiation With Ultraviolet Lamp", Journal of SOL-GEL Science and Technology, 2003, vol. 26, pp. 181-184.
Fortunato.E et al., "Wide-Bandgap High-Mobility ZnO Thin-Film Transistors Produced at Room Temperature", Appl. Phys. Lett. (Applied Physics Letters), Sep. 27, 2007, vol. 85, No. 13, pp. 2541-2543.
Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.
Oh.M et al., "Improving the Gate Stability of ZnO Thin-Film Transistors With Aluminum Oxide Dielectric Layers", J. Electrchem. Soc. (Journal of the Electrochemical Society), 2008, vol. 155, No. 12, pp. H1009-H1014.
Park.J et al., "Dry etching of ZnO films and plasma-induced damage to optical properties", J. Vac. Sci. Technol. B. (Journal of Vacuum Science & Technology B), Mar. 1, 2003, vol. 21, No. 2, pp. 800-803.
Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
Nomura.K et al., "Carrier transport in transparent oxide semiconductor with intrinsic structural randomness probed using single-cyrstalline InGaO3(ZnO)5 films", Appl. Phys. Lett. (Applied Physics Letters), Sep. 13, 2004, vol. 85, No. 11, pp. 1993-1995.
Taiwanese Office Action (Application No. 100137565) Dated Nov. 27, 2015.

\* cited by examiner

SEMICONDUCTOR DEVICE

BACKGROUND OF THE INVENTION

1. Field of the Invention

An embodiment of the present invention relates to a semiconductor device including a transistor or a semiconductor device including a circuit which is formed by using a transistor. For example, an embodiment of the present invention relates to a semiconductor device including a transistor in which a channel formation region is formed using an oxide semiconductor or a semiconductor device including a circuit which is formed by using such a transistor.

2. Description of the Related Art

A technique for manufacturing a transistor or the like by using an oxide semiconductor film for a channel formation region and applying it to a display device has been attracting attention. Examples of such a transistor include a transistor in which zinc oxide (ZnO) is used as an oxide semiconductor film and a transistor in which $InGaO_3(ZnO)_m$ is used as an oxide semiconductor film. A technique for manufacturing such a transistor including an oxide semiconductor film over a light-transmitting substrate and applying it to a switching element or the like of an image display device is disclosed in Patent Documents 1 and 2.

An inverted staggered (bottom gate) transistor in which an oxide semiconductor film containing In, Ga, and Zn is used as a semiconductor layer and buffer layers formed of a metal oxide are provided between the semiconductor layer and source and drain electrode layers is disclosed in Patent Document 3. In this transistor, an ohmic contact is formed by intentionally providing the metal oxide layers as the buffer layers between the semiconductor layer and the source and drain electrode layers.

Reference

Patent Document

[Patent Document 1] Japanese Published Patent Application No. 2007-123861

[Patent Document 2] Japanese Published Patent Application No. 2007-096055

[Patent Document 3] Japanese Published Patent Application No. 2010-056539

SUMMARY OF THE INVENTION

There are various modes for display devices; in the field of liquid crystal display devices, a blue-phase liquid crystal has been attracting attention. In addition, in display devices called electronic paper, a medium which can electrically control the contrast (also called electronic ink or the like) is used. Further, self-luminous display devices using electroluminescent materials have been put to practical use. For such new display modes, a transistor used in a display device is expected to have higher withstand voltage.

In view of the above, it is an object of an embodiment of the present invention to provide a semiconductor device having a novel structure and a method for manufacturing the semiconductor device. For example, it is an object to improve the reliability of a transistor which is driven by high voltage or large current.

An embodiment of the present invention is a semiconductor device including a transistor in which buffer layers are provided between a semiconductor layer forming a channel formation region and source and drain electrode layers. The buffer layers are provided between the semiconductor layer forming a channel formation region and the source and drain electrode layers in order to increase contact resistance with the semiconductor layer forming a channel formation region; the buffer layer particularly relieves an electric field in the vicinity of a drain edge and improves the withstand voltage of the transistor.

A wide-gap semiconductor material whose band gap is wider than that of a silicon semiconductor is used for the semiconductor layer. As the wide-gap semiconductor material, an oxide semiconductor material formed of a metal oxide is used. A preferable example of the oxide semiconductor material is an oxide semiconductor material containing zinc oxide; for example, an oxide semiconductor material containing, as well as zinc oxide, an oxide of gallium, an oxide of indium, an oxide of tin, or the like can be employed.

The oxide semiconductor layer for forming a channel formation region is preferably a highly purified intrinsic or substantially intrinsic oxide semiconductor layer. Hydrogen contained in the oxide semiconductor increases the carrier concentration; therefore, the hydrogen concentration therein is preferably lower than or equal to $5 \times 10^{19}$ cm$^{-3}$, more preferably lower than or equal to $5 \times 10^{18}$ cm$^{-3}$.

An alkali metal such as lithium, sodium, or potassium, or an alkaline earth metal is an unfavorable element in the oxide semiconductor; therefore, it is preferable that an alkali metal or an alkaline earth metal be contained in the oxide semiconductor as few as possible. Of alkali metals, in particular, sodium cuts a bond between a metal element and oxygen or enters the bond to generate a defect in the oxide semiconductor; as a result, transistor characteristics deteriorate (e.g., the transistor becomes normally on (the threshold voltage is shifted to a negative side) or the mobility is decreased). Therefore, it is preferable to reduce the amount of sodium.

The above problem is significant especially in the case where the hydrogen concentration in the oxide semiconductor is sufficiently low. Therefore, the concentration of an alkali metal is strongly required to be sufficiently reduced in the case where the hydrogen concentration in the oxide semiconductor is lower than or equal to $5 \times 10^{19}$ cm$^{-3}$, in particular, lower than or equal to $5 \times 10^{18}$ cm$^{-3}$. For example, the sodium concentration in the oxide semiconductor layer may be lower than or equal to $5 \times 10^{16}$ cm$^{-3}$, preferably lower than or equal to $1 \times 10^{16}$ cm$^{-3}$, more preferably lower than or equal to $1 \times 10^{15}$ cm$^{-3}$. Similarly, the lithium concentration may be lower than or equal to $5 \times 10^{15}$ cm$^{-3}$, preferably lower than or equal to $1 \times 10^{15}$ cm$^{-3}$, and the potassium concentration may be lower than or equal to $5 \times 10^{15}$ cm$^{-3}$, preferably lower than or equal to $1 \times 10^{15}$ cm$^{-3}$.

The highly purified oxide semiconductor layer has very high resistance. When the withstand voltage is insufficient in such a condition, it is assumed that a problem (1) arises: a drain is substantially lost owing to an oxidation reaction of the source and drain electrode layers which is expected to occur at a contact interface between the source and drain electrode layers and the oxide semiconductor layer. In addition, there is also a problem (2): when hydrogen, a hydroxyl group (OH), or moisture ($H_2O$) remains in a channel etched part on the back channel side (the side of the oxide semiconductor layer which is opposite to a gate insulating layer), the channel etched part becomes n-type and a parasitic channel is formed, and this parasitic channel causes insufficient withstand voltage.

In order to solve the problem (1), it is preferable to electrically connect the oxide semiconductor layer and the source and drain electrode layers with n-type or n$^+$-type buffer layers provided therebetween. In addition, in order to solve the problem (2), a structure is employed in which the buffer layers provided between the source and drain electrode layers and the oxide semiconductor layer relieve an electric field.

For example, the buffer layer preferably has a shape extending toward the channel formation region such that an eaves portion is formed from a region overlapping with the source or drain electrode layer toward the channel formation region. With such an eaves portion, an electric field can be prevented from being concentrated on an edge portion of the drain electrode layer, so that the effect of relieving an electric field can be improved.

The buffer layer is preferably formed using an oxide material like the channel formation region. By using oxide materials for both the semiconductor layer in which a channel formation region is formed and the buffer layer, even when the semiconductor layer in which a channel formation region is formed and the buffer layer are stacked, cross-contamination of oxygen can be prevented. In addition, with the structure in which the oxide semiconductor layer is not directly in contact with the source and drain electrode layers, an oxidation reaction of the source and drain electrode layers, in which oxygen is extracted from the oxide semiconductor layer, can be prevented. As a material for forming the buffer layer, an oxide of indium, an oxide of zinc, or an oxide of tin; or a conductive oxide material including a combination of two or more of the above can be used.

The buffer layer preferably has lower resistivity than the oxide semiconductor layer in which a channel formation region is formed. The buffer layer is provided so as to increase the withstand voltage of the transistor, and the resistivity of the buffer layer is preferably higher than or equal to 1 $\Omega$cm. The buffer layer can also be called an $n^-$-layer and has a function of an $n^-$-layer which is a kind of LDD region in a transistor formed using silicon, and is provided so as to increase the contact resistance with the oxide semiconductor layer. In this specification, a layer formed of a conductive oxide material whose resistivity is higher than or equal to 1 $\Omega$cm is called a buffer layer, that is, an $n^-$-layer, and its resistivity can be adjusted by mixing an insulating material into the conductive oxide material. As the insulating material mixed into the conductive oxide material, an oxide insulating material is preferable; for example, silicon oxide or the like is preferable because it is stable as a material.

Since the buffer layer and the semiconductor layer in which a channel formation region is formed are stacked, the resistance value of this region can also be adjusted by adjusting the thickness of the buffer layer.

The buffer layer includes one layer or plural layers stacked. In the case where the buffer layer includes plural layers, it is preferable that the resistivity be decreased from the semiconductor layer side where the channel formation region is formed stepwise or successively. With such a layered buffer layer, concentration of an electric field is relieved and the withstand voltage of the transistor is increased.

In accordance with an embodiment of the present invention, by providing buffer layers between a semiconductor layer in which a channel formation region is formed and source and drain electrode layers, concentration of an electric field is relieved with the buffer layers and the withstand voltage of a transistor can be increased.

By using oxide materials for both the semiconductor layer in which a channel formation region is formed and the buffer layers, cross-contamination of oxygen can be prevented and operation of the transistor can be stable, that is, the reliability of the transistor can be improved.

With the buffer layers having a layered structure including plural layers, concentration of an electric field between the channel formation region and the source and drain electrode layers can be relieved and the withstand voltage of the transistor can be increased.

DETAILED DESCRIPTION OF THE INVENTION

Hereinafter, an embodiment and an example of the present invention will be described in detail with reference to the accompanying drawings. However, the present invention is not limited to the description below, and it is easily understood by those skilled in the art that modes and details thereof can be modified in various ways. In addition, the present invention is not construed as being limited to the following description of the embodiment and the example.

(Embodiment 1)

In this embodiment, a transistor and a manufacturing process thereof will be described with reference to FIGS. 1A and 1B and FIG. 2.

Figure 1A:
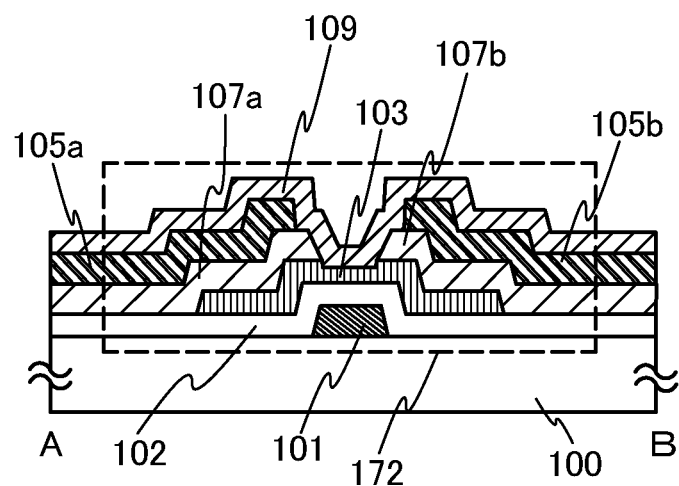
FIGS. 1A and 1B are a cross-sectional view and a top view illustrating an embodiment of the present invention.
Figure 1B:
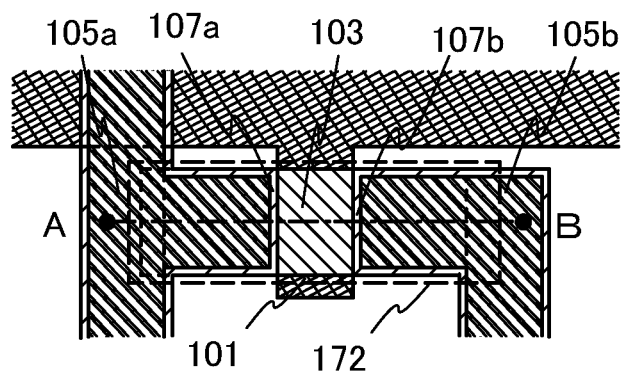

FIG. 1B is a top view, and FIG. 1A is a cross-sectional view taken along chain line A-B in FIG. 1B.

In FIGS. 1A and 1B, a transistor 172 is provided over a substrate 100 having an insulating surface. The transistor 172 includes a gate electrode layer 101, a gate insulating layer 102, an oxide semiconductor layer 103, buffer layers 107a and 107b, and source or drain electrode layers 105a and 105b.

With the buffer layers 107a and 107b, electric-field concentration which might occur between the oxide semiconductor layer 103 and the source electrode layer or electric-field concentration which might occur between the oxide semiconductor layer 103 and the drain electrode layer is relieved and degradation of the switching characteristics of the transistor is suppressed.

Figure 2:
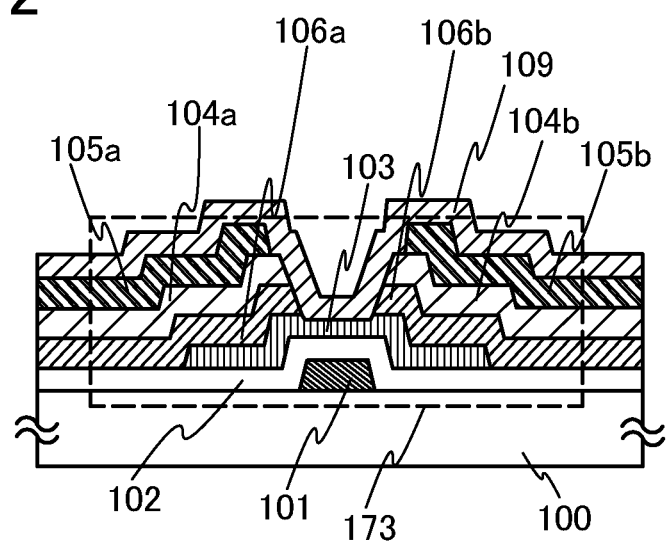
FIG. 2 is a cross-sectional view illustrating an embodiment of the present invention.

FIG. 2 is a cross-sectional view illustrating another example in which the buffer layer has a layered structure. In FIG. 2, a transistor 173 is provided over a substrate 100 having an insulating surface. The transistor 173 includes a gate electrode layer 101, a gate insulating layer 102, an oxide semiconductor layer 103, first buffer layers 106a and 106b, second buffer layers 104a and 104b, and source or drain electrode layers 105a and 105b. In FIG. 2, the same portions as those in FIG. 1A are denoted by the same reference numerals.

The first buffer layers 106a and 106b and the second buffer layers 104a and 104b serve as layered buffer layers, and electric-field concentration which might occur between the oxide semiconductor layer 103 and the source electrode layer or electric-field concentration which might occur between the oxide semiconductor layer 103 and the drain electrode layer is relieved and degradation of the switching characteristics of the transistor is suppressed.

As a material of the buffer layers 107a and 107b, the first buffer layers 106a and 106b, and the second buffer layers 104a and 104b, the following materials can be employed: an In—Sn—O-based metal oxide, an In—Sn—Zn—O-based metal oxide, an In—Al—Zn—O-based metal oxide, a Sn—Ga—Zn—O-based metal oxide, an Al—Ga—Zn—O-based metal oxide, a Sn—Al—Zn—O-based metal oxide, an In—Zn—O-based metal oxide, a Sn—Zn—O-based metal oxide, an Al—Zn—O-based metal oxide, an In—O-based metal oxide, a Sn—O-based metal oxide, and a Zn—O-based metal oxide. The thickness of the buffer layer is greater than or equal to 100 nm; specifically, it is selected as appropriate to be in the range of greater than or equal to 100 nm and less than or equal to $1 \times 10^5$ nm.

Film formation was performed using an In—Sn—O-based target containing $SiO_2$ at 1 wt %, an In—Sn—O-based target containing $SiO_2$ at 3 wt %, an In—Sn—O-based target containing $SiO_2$ at 5 wt %, an In—Sn—O-based target containing $SiO_2$ at 15 wt %, and an In—Sn—O-based target containing $SiO_2$ at 20 wt %, and measurement results of resistivities are shown in Table 1. The film formation condition was as follows: a target whose diameter was 8 inches was used, the pressure was 0.4 Pa, the flow of an argon gas was 50 sccm, the flow of an oxygen gas was 2 sccm, and the power was 1 kW.

TABLE 1

| Percentage of $SiO_2$ | Resistivity ($\mu\Omega$cm) |
| --- | --- |
| 1 wt % | 834.36 |
| 3 wt % | 1976 |
| 5 wt % | 3298 |
| 15 wt % | 41710 |
| 20 wt % | 12105206 |

In the structure of FIGS. 1A and 1B, an In—Sn—O-based target containing $SiO_2$ at higher than or equal to 1 wt % and lower than or equal to 20 wt % is used to form the buffer layers 107a and 107b. Therefore, by adjusting the percentage of $SiO_2$ contained in the buffer layers 107a and 107b to be higher than or equal to 1 wt % and lower than or equal to 20 wt %, the resistivity of the buffer layers 107a and 107b can be higher than or equal to 800 $\mu\Omega$cm and lower than or equal to 12105300 $\mu\Omega$cm. In addition, in the structure of FIG. 2, the resistivity of the second buffer layer is made lower than the resistivity of the first buffer layer. For example, the first buffer layers 106a and 106b are formed by a sputtering method using an In—Sn—O-based target containing $SiO_2$ at higher than or equal to 15 wt % and lower than or equal to 20 wt %, and the second buffer layers 104a and 104b are formed by a sputtering method using an In—Sn—O-based target containing $SiO_2$ at higher than or equal to 1 wt % and lower than 15 wt %.

The transistor including the buffer layers of this embodiment has small off-state current, and a semiconductor device including such a transistor can have excellent electric characteristics and high reliability.

An example of a method for manufacturing the transistor 172 in FIGS. 1A and 1B and the transistor 173 in FIG. 2 is described below.

First, the gate electrode layer 101, the gate insulating layer 102, and the oxide semiconductor layer 103 are formed over the substrate 100. As the substrate 100, the following can be used: an alkali-free glass substrate manufactured by a fusion method or a floating method, such as a barium borosilicate glass substrate, an aluminoborosilicate glass substrate, or an aluminosilicate glass substrate; a ceramic substrate; a heat-resistant plastic substrate that can resist process temperature of this manufacturing process; or the like.

Further, an insulating film may be provided as a base film over the substrate 100. The base film may be formed with a single layer or plural layers using one or more of a silicon oxide film, a silicon nitride film, a silicon oxynitride film, and a silicon nitride oxide film by a CVD method, a sputtering method, or the like.

The gate electrode layer 101 is formed using a metal material such as titanium, molybdenum, chromium, tantalum, tungsten, or aluminum, or an alloy material thereof. The gate electrode layer 101 can be formed in such a manner that a conductive film is formed over the substrate 100 by a sputtering method or a vacuum evaporation method, a mask is formed over the conductive film by a photolithography technique or an inkjet method, and the conductive film is etched using the mask.

In addition, a layered structure may be used for the gate electrode layer 101. As one layer in the layered structure, an In—Sn—O-based metal oxide, an In—Sn—Zn—O-based metal oxide, an In—Al—Zn—O-based metal oxide, a Sn—Ga—Zn—O-based metal oxide, an Al—Ga—Zn—O-based metal oxide, a Sn—Al—Zn—O-based metal oxide, an In—Zn—O-based metal oxide, a Sn—Zn—O-based metal oxide, an Al—Zn—O-based metal oxide, an InO-based metal oxide, a Sn—O-based metal oxide, or a Zn—O-based metal oxide may be used. It is particularly preferable that the gate electrode layer 101 have a layered structure and, as one layer in the layered structure, an oxynitride film containing indium, gallium, and zinc which are materials having a high work function (also referred to as an IGZON film) be used. The oxynitride film containing indium, gallium, and zinc is formed in a mixed gas atmosphere containing argon and nitrogen.

The gate insulating layer 102 can be formed with a single layer or plural layers using one or more of silicon oxide, silicon oxynitride, silicon nitride oxide, aluminum oxide, aluminum oxynitride, gallium oxide, hafnium oxide, yttrium oxide, and the like by a CVD method, a sputtering method, or the like.

The oxide semiconductor layer 103 is formed with a thickness of greater than or equal to 5 nm and less than or equal to 50 µm by a sputtering method or the like with the use of a metal oxide target containing at least zinc. As a typical example of the metal oxide target, a four-component metal oxide such as an In—Sn—Ga—Zn—O-based metal oxide, a three-component metal oxide such as an In—Ga—Zn—O-based metal oxide, an In—Sn—Zn—O-based metal oxide, an In—Al—Zn—O-based metal oxide, a Sn—Ga—Zn—O-based metal oxide, an Al—Ga—Zn—O-based metal oxide, or a Sn—Al—Zn—O-based metal oxide, a two-component metal oxide such as an In—Zn—O-based metal oxide or a Sn—Zn—O-based metal oxide can be used.

For example, as the metal oxide target, a metal oxide target which contains In, Ga, and Zn and has a composition ratio of $In_2O_3:Ga_2O_3:ZnO=1:1:1$ [molar ratio] is used. Alternatively, a target having a composition ratio of $In_2O_3:Ga_2O_3:ZnO=1:1:2$ [molar ratio], a target having a composition ratio of $In_2O_3:Ga_2O_3:ZnO=1:1:4$ [molar ratio], or a target having a composition ratio of $In_2O_3:Ga_2O_3:ZnO=2:1:8$ [molar ratio] can be used. An oxide semiconductor obtained by a sputtering method with the use of a metal oxide target containing In, Ga, and Zn is represented by In—Ga—Zn—O, and its oxide semiconductor material is $InGaO_3(ZnO)_m$ (m>0 and m is not a natural number). The fact that m is not a natural number can be confirmed by analysis using ICP-MS or RBS.

In addition, at the formation of the oxide semiconductor layer 103, by setting the pressure of a treatment chamber in a sputtering apparatus to lower than or equal to 0.4 Pa, entry of an impurity such as an alkali metal or hydrogen into a surface where a film is formed or a film to be deposited can be reduced. Note that hydrogen may be contained in the film to be deposited as a hydrogen molecule, water, a hydroxyl group, or hydride in some cases in addition to a hydrogen atom.

In addition, at the formation of the oxide semiconductor layer 103, the distance between the target and the substrate (a T-S distance) is set to greater than or equal to 40 mm and less than or equal to 300 mm (preferably, greater than or equal to 60 mm).

In addition, at the formation of the oxide semiconductor layer 103 by a sputtering method, the temperature of the surface where a film is formed is preferably higher than or equal to 250° C. and lower than or equal to the upper limit of the heat treatment temperature for the substrate. The temperature at which entry of an impurity such as water or hydrogen into the film to be deposited is prevented and the impurity is released to a vapor phase in the chamber is 250° C. In addition, the upper limit of the temperature of the surface where a film is formed in the film formation by a sputtering method is the upper limit of the heat treatment temperature for the substrate or the upper limit of the temperature of the film to be deposited (if the temperature exceeds the latter upper limit, components in the film significantly change).

Moreover, when the leakage rate of the treatment chamber of the sputtering apparatus is set to less than or equal to $1\times10^{-10}$ Pa·m³/second at the formation of the oxide semiconductor layer 103, entry of an impurity such as an alkali metal or hydride into the oxide semiconductor layer 103 that is being formed by a sputtering method can be reduced. Further, with the use of an entrapment vacuum pump (e.g., a cryopump) as an evacuation system, counter flow of an impurity such as an alkali metal, a hydrogen atom, a hydrogen molecule, water, a hydroxyl group, or hydride from the evacuation system can be reduced.

The gate insulating layer 102 and the oxide semiconductor layer 103 are preferably formed in succession without exposure to the air. With the successive formation, the interface between the stacked layers can be formed without being contaminated by an atmospheric component or a contamination impurity element contained in the air.

After the oxide semiconductor layer 103 is formed, if necessary, heat treatment may be performed in an atmosphere which hardly contains hydrogen and moisture (a nitrogen atmosphere, an oxygen atmosphere, a dry-air atmosphere (for example, as for moisture, the dew point is lower than or equal to −40° C., preferably lower than or equal to −60° C.), or the like) at a temperature of higher than or equal to 200° C. and lower than or equal to 700° C. This heat treatment can be called dehydration or dehydrogenation, which is for detaching H, OH, or the like from the oxide semiconductor layer. In the case where the temperature is raised in an inert atmosphere and the atmosphere is switched to an atmosphere containing oxygen during heat treatment, or in the case where an oxygen atmosphere is employed, the heat treatment can also be called additional oxidation treatment.

Then, the buffer layers 107a and 107b are formed on and in contact with the oxide semiconductor layer 103. Also the buffer layer is preferably formed in succession after forming the oxide semiconductor layer 103 without exposure to the air. With the successive formation, the interface between the stacked layers can be formed without being contaminated by an atmospheric component or a contamination impurity element contained in the air.

The buffer layers 107a and 107b are formed with a thickness of greater than or equal to 100 nm and less than or equal to 10000 nm by a sputtering method with the use of an In—Sn—O-based target containing $SiO_2$ at higher than or equal to 1 wt % and lower than or equal to 20 wt % in an atmosphere of oxygen or argon, or a mixed atmosphere containing argon and oxygen. The resistivity of the buffer layers 107a and 107b is lower than that of the oxide semiconductor layer 103 in which a channel formation region is formed, and higher than that of the source or drain electrode layers which are formed later.

In addition, in the case of a buffer layer having a layered structure, the second buffer layers 104a and 104b are formed on and in contact with the first buffer layers 106a and 106b as illustrated in FIG. 2. The resistivity of the second buffer layers 104a and 104b is lower than that of the first buffer layers 106a and 106b, and higher than that of the source or drain electrode layers which are formed later. It is needless to say that the resistivity of the first buffer layers 106a and 106b is lower than that of the oxide semiconductor layer 103 in which a channel formation region is formed.

Then, a metal conductive film is formed over the buffer layer.

As a material of the metal conductive film which are to be the source or drain electrode layers 105a and 105b, a metal material such as Al, Cu, Cr, Ta, Ti, Mo, or W, or an alloy material containing the metal material as a component is used. In addition, a structure in which a layer of a refractory metal such as Cr, Ta, Ti, Mo, or W is stacked on a lower side and/or an upper side of a metal layer of Al, Cu, or the like may be used.

For example, the metal conductive film preferably has a three-layer structure in which an aluminum layer is stacked over a titanium layer and a titanium layer is stacked over the aluminum layer, or a three-layer structure in which an aluminum layer is stacked over a molybdenum layer and a molybdenum layer is stacked over the aluminum layer. Alternatively, the metal conductive film can have a two-layer structure in which an aluminum layer and a tungsten layer are stacked, a two-layer structure in which a copper layer and a tungsten layer are stacked, or a two-layer structure in which an aluminum layer and a molybdenum layer are stacked. It is needless to say that the metal conductive film may have a single-layer structure or a layered structure including four or more layers.

Then, a resist mask is formed over the metal conductive film by a photolithography step, and etching is performed selectively, whereby the source or drain electrode layers 105a and 105b are formed. After that, the buffer layer is selectively etched to expose part of the oxide semiconductor layer 103, and the resist mask is removed. Note that in the photolithography step, part of the oxide semiconductor layer 103 is etched, whereby an oxide semiconductor layer having a groove (a depressed portion) is formed.

Figure 3A:
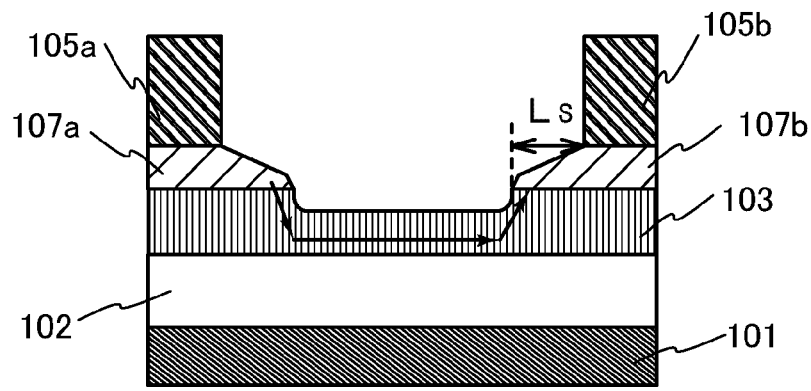
FIGS. 3A to 3C are schematic views each illustrating the periphery of an edge portion of a buffer layer, which is enlarged.

In order to relieve concentration of an electric field effectively, the following shape is preferably employed: as illustrated in FIG. 3A, the edge portions of the buffer layers 107a and 107b extend beyond the side surfaces of the source or drain electrode layers 105a and 105b and part of the upper surfaces of the buffer layers are exposed. Note that "the edge portion of the buffer layer extends beyond the side surface of the source or drain electrode layer" means "the edge portion of the buffer layer exists between the lower edge portion of the source or drain electrode layer and the channel formation region formed of an oxide semiconductor". FIG. 3A is a schematic view illustrating the peripheries of the edge portions of the buffer layers 107a and 107b illustrated in FIG. 1A, which are enlarged. As illustrated in FIG. 3A, in the photolithography step in which part of the oxide semiconductor layer 103 is exposed, the side surfaces of the buffer layers may each be processed into a tapered shape (also called an eaves shape), and the tapered portion (also called the eaves portion) may function as a region for reliving electric-field concentration. Note that the buffer layers 107a and 107b become thinner and have higher resistance toward the tips of the edge portions.

Figure 3B:
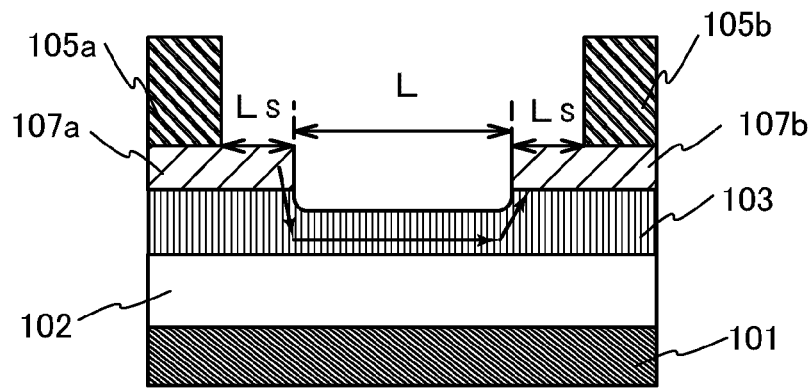

The edge portion of the buffer layer is not limited to have the tapered shape illustrated in FIG. 3A and may have various cross-sectional shapes depending on the material of the buffer layer or the etching conditions. FIG. 3B is an enlarged view of an example different from that in FIG. 3A. The length (Ls) of a region for relieving electric-field concentration in the channel length direction is a horizontal distance from the lower edge portion of the source or drain electrode layer 105a or 105b to the lower edge portion of the buffer layer 107a or 107b.

Figure 3C:
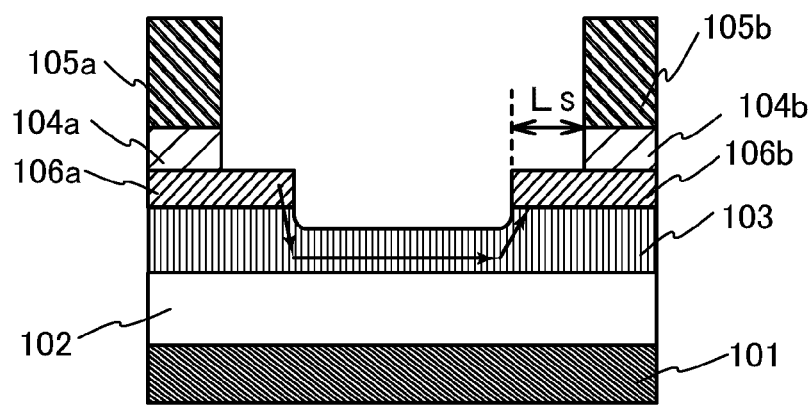

FIG. 3C is an enlarged view of an example different from that in FIG. 2. FIG. 3C illustrates an example in which the positions of the upper edge portions of the first buffer layers 106a and 106b and the positions of the lower edge portions of the second buffer layers 104a and 104b are not aligned with each other, and part of the upper surfaces of the first buffer layers 106a and 106b are exposed. The length (Ls) of a region for relieving electric-field concentration in the channel length direction is a horizontal distance from the lower edge portion of the source or drain electrode layer 105a or 105b to the lower edge portion of the first buffer layer 106a or 106b.

The resistivity of the tapered portion which is the region for relieving electric-field concentration depends on the thickness of the region or the length (Ls) in the channel length direction and may be adjusted to have a desired value by, for example, appropriately selecting the material or setting the thickness of the buffer layer and determining the size of the tapered portion by a practitioner. At least the resistivity of the tapered portion of the buffer layer is lower than that of the channel formation region in the oxide semiconductor layer 103.

Next, a protective insulating layer 109 is formed so as to cover the exposed portion of the oxide semiconductor layer 103 so that the oxide semiconductor layer 103 can be protected. As the protective insulating layer 109, a structure including one or more of silicon oxide, silicon oxynitride, silicon nitride, silicon nitride oxide, aluminum oxide, aluminum oxynitride, aluminum gallium oxide, and gallium oxide can be used.

In the case where gallium oxide is used for the protective insulating layer 109, the protective insulating layer 109 is preferably formed with the use of a target obtained by mixing zinc oxide (of higher than or equal to 1 wt %) into gallium oxide to be formed by a DC sputtering method. In this case, the protective insulating layer 109 includes gallium oxide containing zinc oxide.

Note that the thickness of the protective insulating layer 109 is greater than or equal to 50 nm, preferably greater than or equal to 200 nm and less than or equal to 500 nm. With the protective insulating layer 109 being thick, the amount of oxygen released from the protective insulating layer 109 can be increased, and thus defects at the interface between the protective insulating layer 109 and the oxide semiconductor layer 103 can be reduced. The protective insulating layer 109 from which part of contained oxygen is released by heat treatment is easily formed by a sputtering method, which is preferable. When the protective insulating layer 109 from which part of contained oxygen is released by heat treatment is formed by a sputtering method, the amount of oxygen contained in a deposition gas is preferably large, and oxygen, a mixed gas of oxygen and a rare gas, or the like can be used. Typically, the oxygen concentration in the deposition gas is preferably higher than or equal to 6% and lower than or equal to 100%.

Through the above-described process, the transistor 172 is formed (see FIG. 1A). By providing the buffer layers between the oxide semiconductor layer in which a channel formation region is formed and the source and drain electrode layers, concentration of an electric field is relieved with the buffer layers and the withstand voltage of the transistor 172 can be increased.

In the case where the buffer layer has a layered structure, after the source or drain electrode layers 105a and 105b are formed, the first buffer layer and the second buffer layer are selectively etched to expose part of the oxide semiconductor layer 103, and the resist mask is removed. In this manner, the transistor 173 is formed (see FIG. 2). When the buffer layer has a layered structure including plural layers, concentration of an electric field between the channel formation region and the source and drain electrode layers can be relieved and the withstand voltage of the transistor can be increased. In order to relieve concentration of an electric field effectively, the following shape is preferably employed: as illustrated in FIG. 2, the edge portions of the first buffer layers 106a and 106b and the edge portions of the second buffer layers 104a and 104b extend beyond the side surfaces of the source or drain electrode layers 105a and 105b and part of the upper surfaces of the second buffer layers 104a and 104b are exposed.

By using oxide materials for both the semiconductor layer in which a channel formation region is formed and the buffer layers, cross-contamination of oxygen can be prevented and operation of the transistor can be stable, that is, the reliability of the transistor can be improved.

As for the oxide semiconductor layer 103 obtained in this embodiment, not the entire oxide semiconductor layer 103 is single crystal, but the oxide semiconductor layer 103 is a non-single-crystal layer with c-axis alignment that is perpendicular to the surface of the oxide semiconductor layer 103, in which a plurality of crystals are included but a-b planes are not aligned with each other.

Note that although an example of a bottom gate transistor is described in this embodiment, an embodiment of the present invention is not limited thereto and a top gate transistor can be employed as appropriate. In addition, a structure in which gate electrode layers are provided over and below an oxide semiconductor layer may be employed.

EXAMPLE

Calculation was performed using the structure illustrated in FIG. 3B and a device simulation tool, Sentaurus Device, manufactured by Synopsys. Inc.

The condition for the calculation includes: a gate insulating layer which is formed of $SiO_x$ and has a thickness of 100 nm, an oxide semiconductor layer in a region which does not overlap with the buffer layers 107a and 107b and has a thickness of 25 nm, oxide semiconductor layers in regions which overlap with the buffer layers 107a and 107b and have a thickness of 30 nm, and the buffer layers 107a and 107b which are formed of ITSO and have a thickness of 50 nm. ITSO is a material containing $In_2O_3$, SnO, and $SiO_2$. In addition, L/W of the transistor is 3 µm/300 µm.

As for the oxide semiconductor layer 103, the dielectric constant is 15, the electron affinity is 4.3 eV, and the band gap (Eg) with ITSO is 3.15 eV. In addition, calculation was performed by setting the work function of the gate electrode layer 101 to 5.3 eV and the work function of the source or drain electrode layers 105a and 105b to 4 eV. The calculation result is shown in FIG. 4.

Figure 4:
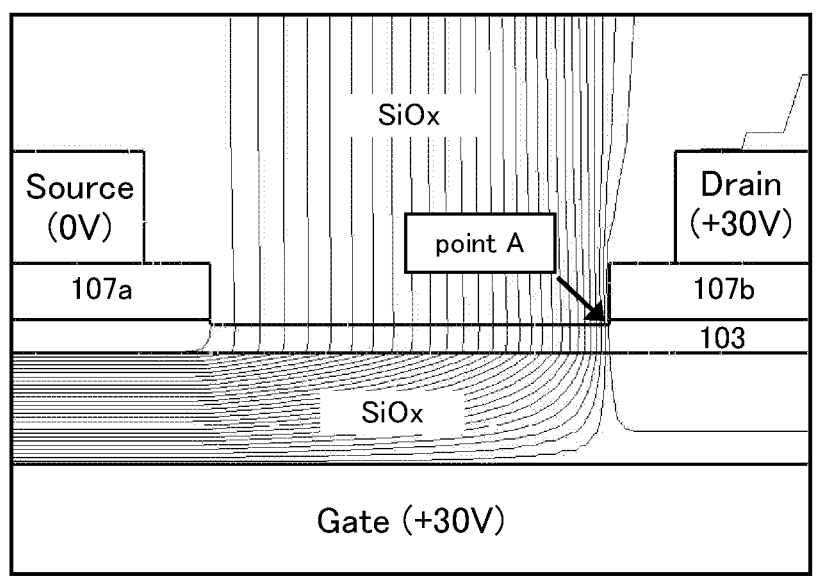
FIG. 4 is an equipotential line diagram.

FIG. 4 is an equipotential line diagram in the case where voltage is applied to the transistor, where Vds=Vgs=+30 V. Note that the resistivity of the buffer layer is set to 3.3E-3 (Ω·cm). From FIG. 4, it is found that a large potential gradient is observed at a drain edge portion denoted by "point A" and high electric-field concentration is caused there.

Figure 5A:
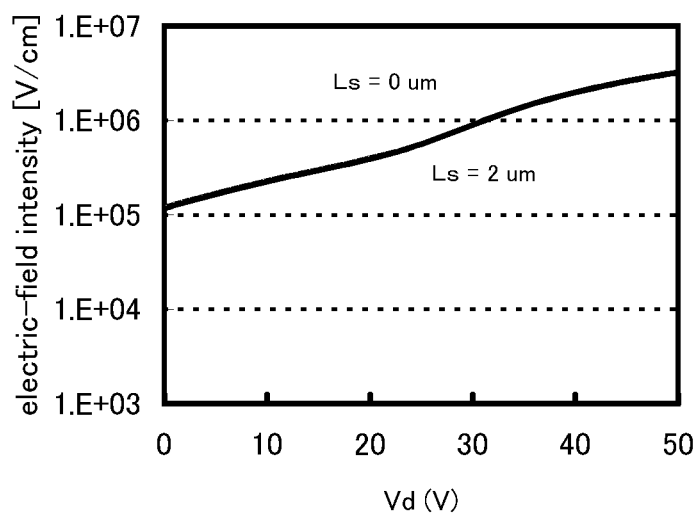
FIGS. 5A and 5B are graphs each showing a relation between electric-field intensity at a drain edge ("point A") and drain voltage.

The case where the length (Ls) of a region for relieving electric-field concentration in the channel length direction is 2 μm and the case where the length (Ls) of a region for relieving electric-field concentration in the channel length direction is 0 μm are compared. That is, FIG. 5A shows a relation between electric-field intensity at the drain edge ("point A") and drain voltage regarding the above two cases. There is substantially no difference when the resistivity of the buffer layer is 3.3E-3 (Ω·cm).

Figure 5B:
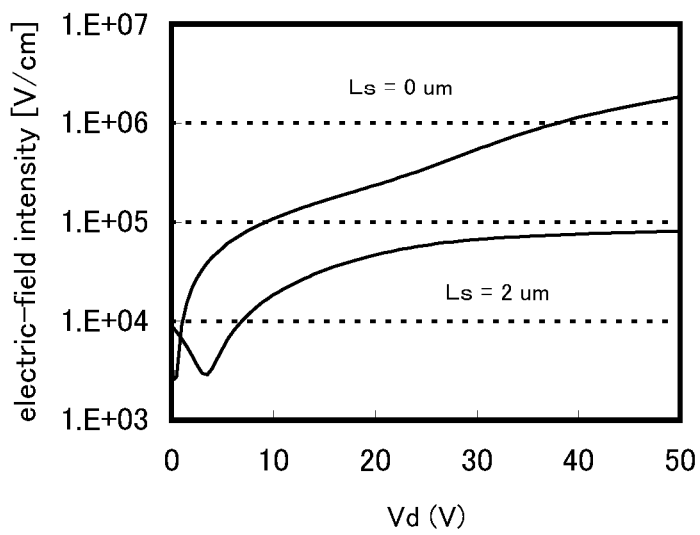

The resistivity of the buffer layer is set to 1.2E+1 (Ω·cm). The case where the length (Ls) of a region for relieving electric-field concentration in the channel length direction is 2 μm and the case where the length (Ls) of a region for relieving electric-field concentration in the channel length direction is 0 μm are compared. FIG. 5B shows a relation between electric-field intensity at the drain edge ("point A") and drain voltage regarding the above two cases. From FIG. 5B, by increasing the length (Ls) of a region for relieving electric-field concentration in the channel length direction, an electric field at "point A" can be decreased. From these results, it can be said that a high-resistance material is preferable to a low-resistance material so that the buffer layer can function as an LDD region.

In FIG. 3A, the cross-sectional shape of the buffer layer is a tapered shape and partly thinner than the buffer layer in FIG. 3B. Therefore, the buffer layer in FIG. 3A has higher resistance than the buffer layer in FIG. 3B. Accordingly, even when the same material is used for the buffer layers, the buffer layer in the structure of FIG. 3A is preferable because it has higher resistance than in the structure of FIG. 3B and an electric field at "point A" can be decreased.

This application is based on Japanese Patent Application serial no. 2010-235986 filed with Japan Patent Office on Oct. 20, 2010, the entire contents of which are hereby incorporated by reference.

What is claimed is:

1. A semiconductor device comprising:
   a gate electrode layer over a substrate;
   a gate insulating layer over the gate electrode layer;
   an oxide semiconductor layer over the gate insulating layer;
   a first buffer layer having n-type conductivity on and in contact with the oxide semiconductor layer;
   a second buffer layer having n-type conductivity on and in contact with the oxide semiconductor layer;
   a source electrode layer on the first buffer layer, wherein the first buffer layer extends beyond an inner side edge of the source electrode layer; and
   a drain electrode layer on the second buffer layer, wherein the second buffer layer extends beyond an inner side edge of the drain electrode layer,
   wherein inner side edges of the first buffer layer and the second buffer layer are tapered,
   wherein the first buffer layer and the second buffer layer comprise an oxide of tin, and
   wherein the oxide semiconductor layer includes crystals whose c-axes are aligned in a direction perpendicular to one surface of the oxide semiconductor layer and whose a-b planes are not aligned with each other.

2. The semiconductor device according to claim 1, wherein the first buffer layer and the second buffer layer further comprise an oxide of indium and an oxide of silicon.

3. The semiconductor device according to claim 1, further comprising an insulating layer over the source electrode layer and the drain electrode layer, wherein the insulating layer is in contact with a surface portion of the oxide semiconductor layer.

4. The semiconductor device according to claim 3, wherein the insulating layer is an oxygen supply layer.

5. The semiconductor device according to claim 1, wherein the first buffer layer and the second buffer layer have a stacked structure.

6. A semiconductor device comprising:
   a gate electrode layer over a substrate;
   a gate insulating layer over the gate electrode layer;
   an oxide semiconductor layer over the gate insulating layer;
   a first buffer layer having n-type conductivity on and in contact with the oxide semiconductor layer;
   a second buffer layer having n-type conductivity on and in contact with the oxide semiconductor layer;
   a source electrode layer on the first buffer layer, wherein the first buffer layer extends beyond an inner side edge of the source electrode layer; and
   a drain electrode layer on the second buffer layer, wherein the second buffer layer extends beyond an inner side edge of the drain electrode layer,
   wherein inner side edges of the first buffer layer and the second buffer layer are tapered,
   wherein the first buffer layer and the second buffer layer comprise an oxide of tin,
   wherein a surface portion of the oxide semiconductor layer between the first buffer layer and the second buffer layer is etched, and
   wherein the oxide semiconductor layer includes crystals whose c-axes are aligned in a direction perpendicular to one surface of the oxide semiconductor layer and whose a-b planes are not aligned with each other.

7. The semiconductor device according to claim 6, wherein the first buffer layer and the second buffer layer further comprise an oxide of indium and an oxide of silicon.

8. The semiconductor device according to claim 6, further comprising an insulating layer over the source electrode layer and the drain electrode layer, wherein the insulating layer is in contact with the surface portion of the oxide semiconductor layer.

9. The semiconductor device according to claim 8, wherein the insulating layer is an oxygen supply layer.

10. The semiconductor device according to claim 6, wherein the first buffer layer and the second buffer layer have a stacked structure.

* * * * *